(12) United States Patent
Kawabata et al.

(10) Patent No.: US 7,999,376 B2
(45) Date of Patent: Aug. 16, 2011

(54) SEMICONDUCTOR DEVICE AND ITS MANUFACTURING METHOD

(75) Inventors: Masahito Kawabata, Kanagawa (JP); Yoshihito Fujiwara, Kanagawa (JP)

(73) Assignee: Panasonic Corporation, Osaka (JP)

( * ) Notice: Subject to any disclaimer, the term of this patent is extended or adjusted under 35 U.S.C. 154(b) by 301 days.

(21) Appl. No.: 11/814,596

(22) PCT Filed: Jan. 25, 2006

(86) PCT No.: PCT/JP2006/301144
§ 371 (c)(1),
(2), (4) Date: Jul. 24, 2007

(87) PCT Pub. No.: WO2006/080351
PCT Pub. Date: Aug. 3, 2006

(65) Prior Publication Data
US 2008/0265436 A1    Oct. 30, 2008

(30) Foreign Application Priority Data

Jan. 25, 2005 (JP) .................................. 2005-016818

(51) Int. Cl.
*H01L 23/48* (2006.01)

(52) U.S. Cl. .. 257/723; 257/724; 257/787; 257/E25.023

(58) Field of Classification Search .................. 257/723, 257/724, 787, E25.023
See application file for complete search history.

(56) References Cited

U.S. PATENT DOCUMENTS

| 6,025,648 A * | 2/2000 | Takahashi et al. ............ 257/778 |
| 6,369,448 B1 * | 4/2002 | McCormick .................. 257/777 |
| 7,026,711 B2 * | 4/2006 | Lee et al. ...................... 257/706 |
| 7,205,646 B2 * | 4/2007 | Lin et al. ...................... 257/686 |
| 2004/0135243 A1 * | 7/2004 | Aoyagi .......................... 257/686 |

FOREIGN PATENT DOCUMENTS

| JP | 11-260851 | 9/1999 |
| JP | 2002-009265 | 1/2002 |
| JP | 2002-170921 | 6/2002 |
| JP | 2002-270760 | 9/2002 |
| JP | 2003-007930 | 1/2003 |
| JP | 2004-006482 | 1/2004 |
| JP | 2004-079923 | 3/2004 |
| JP | 2004-214344 | 7/2004 |

* cited by examiner

*Primary Examiner* — Eugene Lee
(74) *Attorney, Agent, or Firm* — Pearne & Gordon LLP

(57) ABSTRACT

An object of the present invention is to provide a semiconductor device by packaging a plurality of semiconductor chips three-dimensionally in a smaller thickness, with a smaller footprint, at the lower cost without using any other components and through a simpler manufacturing process of the semiconductor device than with the conventional methods.

A flip chip packaging structure is formed by directly connecting a first semiconductor chip (101) reduced in thickness by back grinding and a substrate (105) via a bump electrode (102) to a wiring pattern (106). Also, a second semiconductor chip (103) is formed with an electrode (104) that is higher than the sum of the thickness of the first semiconductor chip (101) and the height of the electrode (102), and the electrode (104) is directly connected to the wiring pattern (106) on the substrate (105), whereby the most-compact three-dimensional semiconductor packaged device is produced.

8 Claims, 13 Drawing Sheets

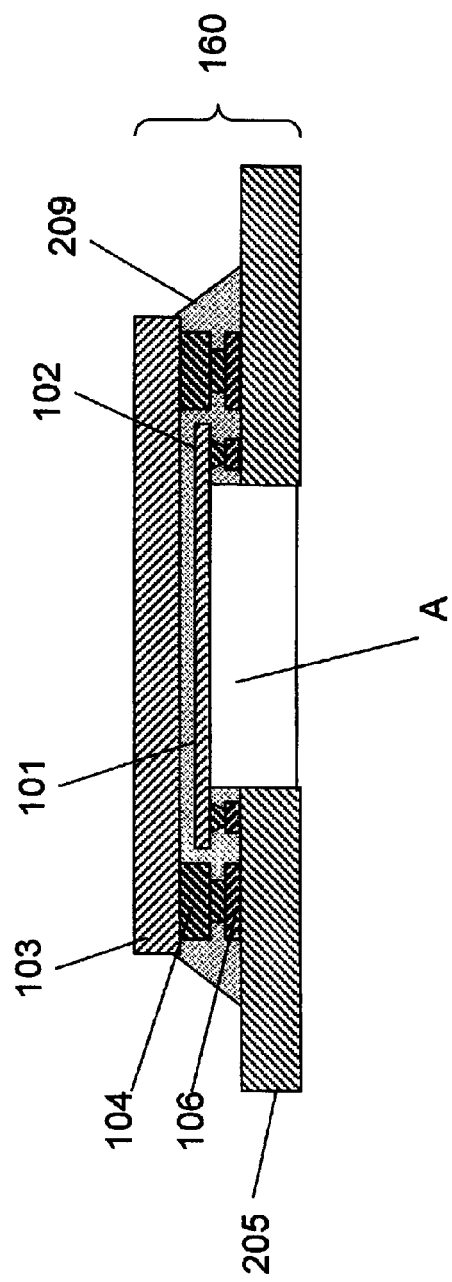
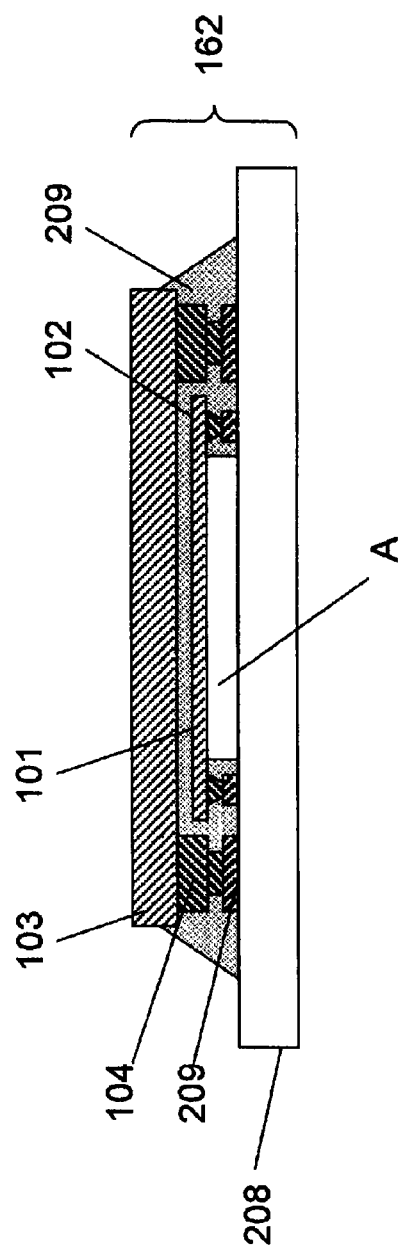
FIG. 6 (a)
FIG. 6 (b)

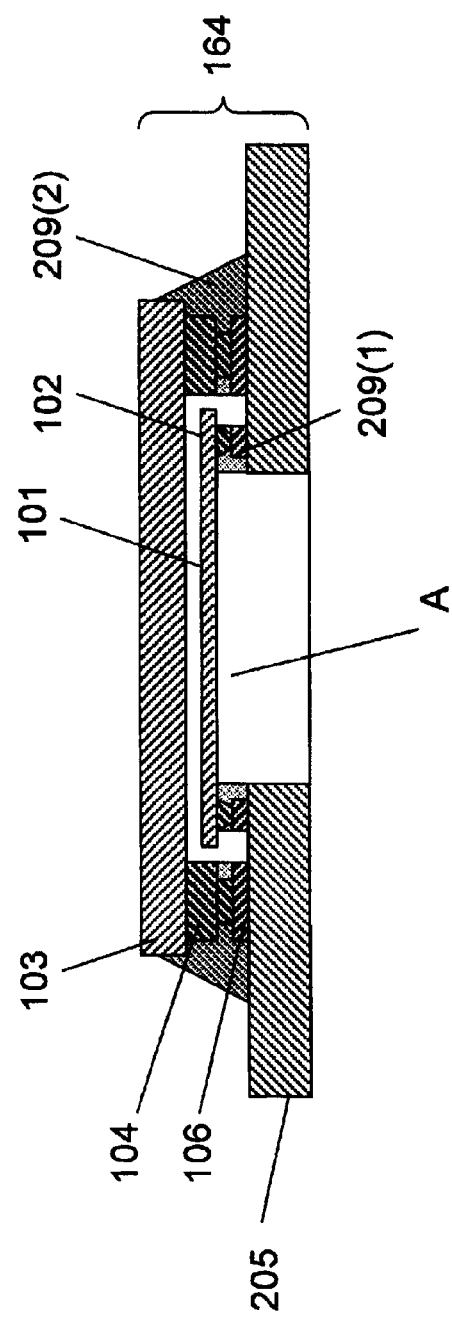
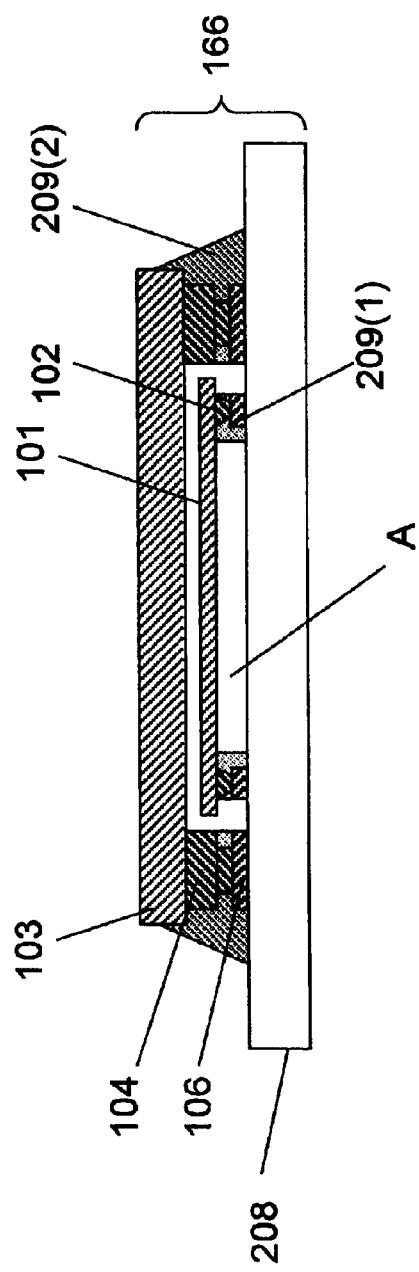
FIG. 7 (a)
FIG. 7 (b)

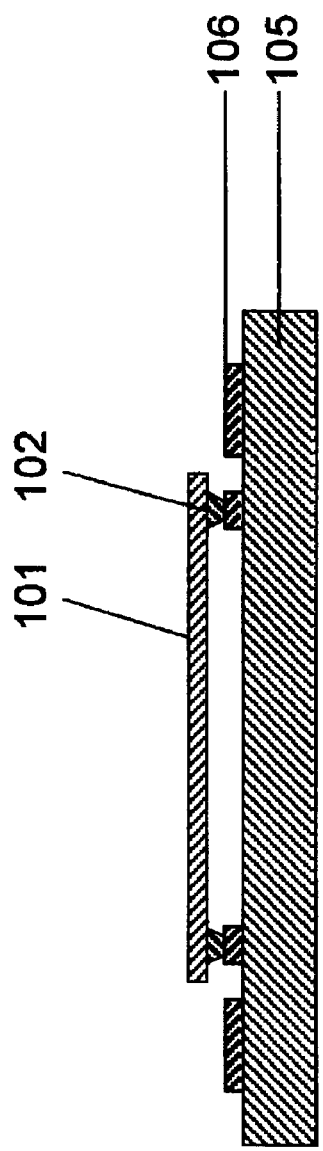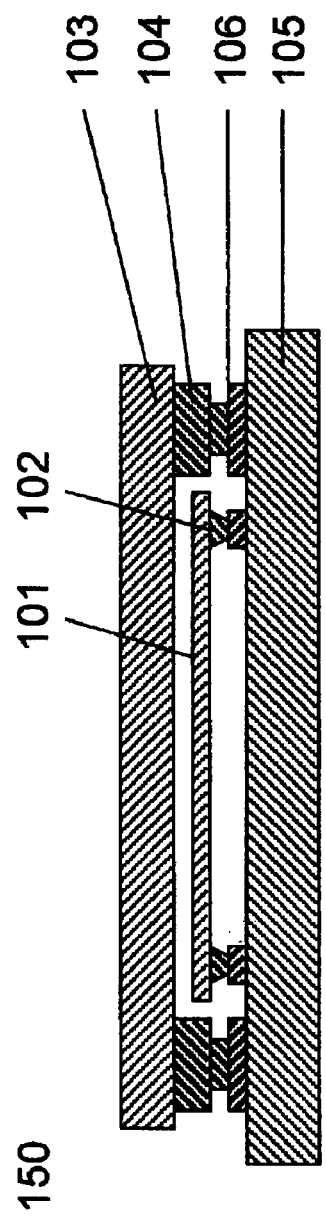
FIG. 8 (a)
FIG. 8 (b)
FIG. 8 (c)

FIG. 12 (a)
 
FIG. 12 (b)
 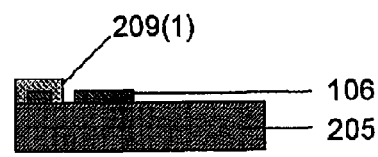
FIG. 12 (c)
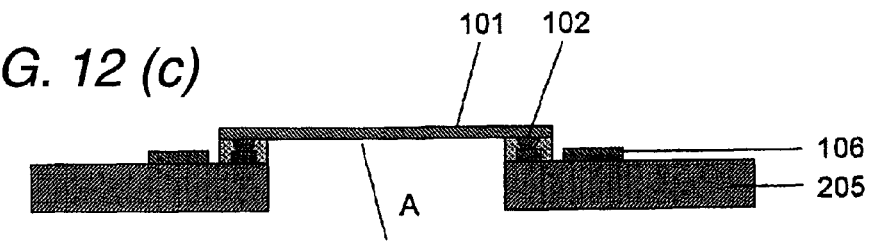
FIG. 12 (d)
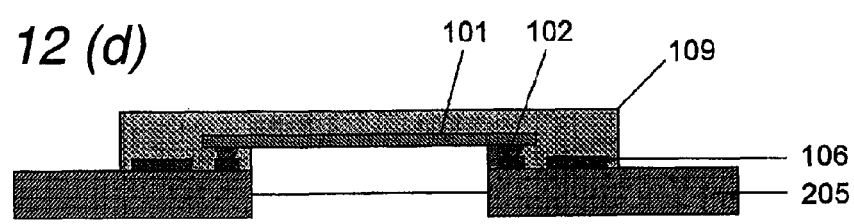
FIG. 12 (e)
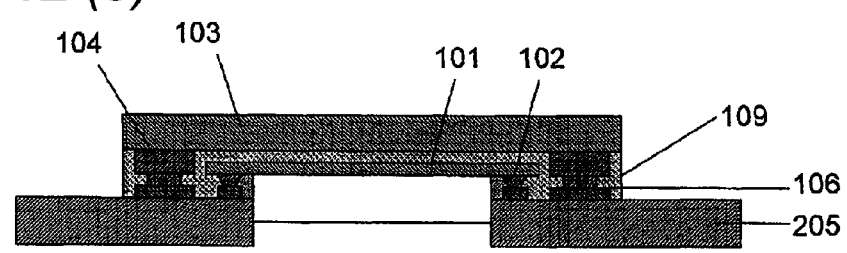
FIG. 12 (f)
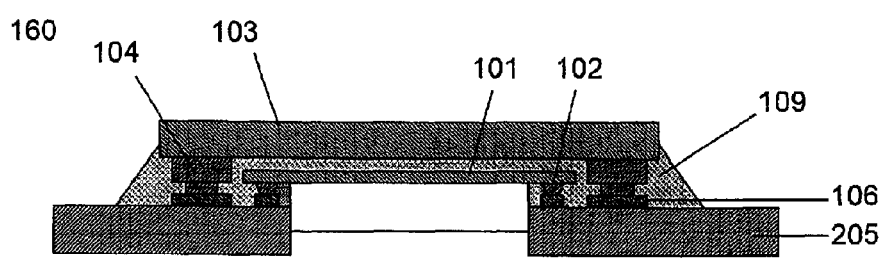

FIG. 13 (a)
 
FIG. 13 (b)
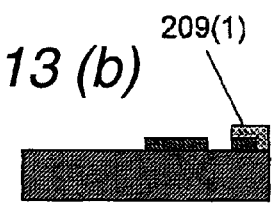 
FIG. 13 (c)
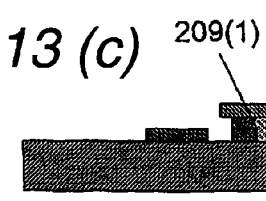 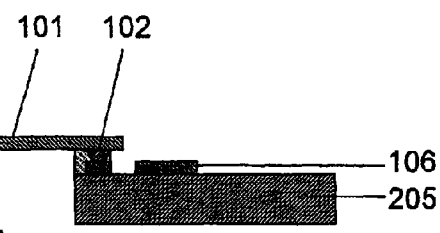
FIG. 13 (d)
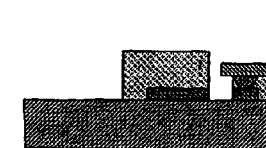 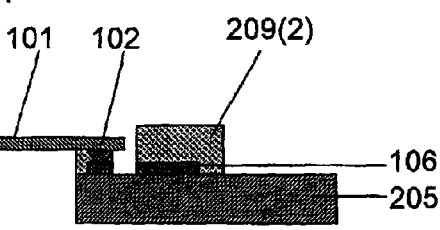
FIG. 13 (e)
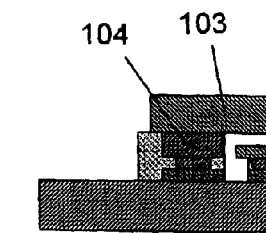 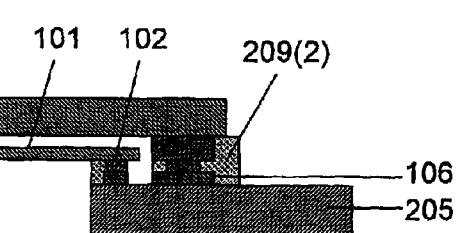
FIG. 13 (f)
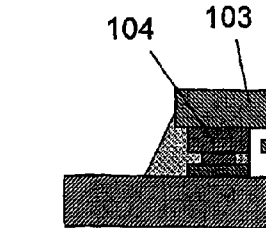 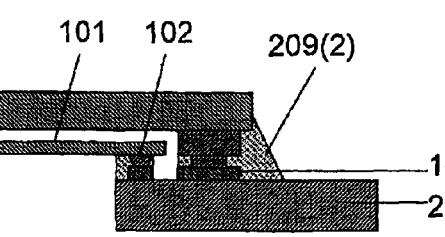

SEMICONDUCTOR DEVICE AND ITS MANUFACTURING METHOD

TECHNICAL FIELD

The present invention relates to a semiconductor device and its manufacturing method in which a plurality of semiconductor chips are mounted by flip chip packaging three-dimensionally on a common substrate.

BACKGROUND ART

To achieve the higher density and smaller size of semiconductor devices, a flip chip packaging is mostly employed to package the semiconductor chips on a substrate. The flip chip packaging is a packaging method in which semiconductor bear chips having no packaging structure are packaged face down on a wiring pattern of the substrate.

Conventionally, a packaging structure has been proposed in which another semiconductor chip is stacked on one semiconductor chip that is mounted by flip chip packaging (or another semiconductor chip is arranged three-dimensionally on one semiconductor chip) to reduce the packaging area (patent documents 1 to 3).

In patent document 1, another semiconductor chip is stacked on one semiconductor chip, and a wire bonding is employed for the connection between the upper semiconductor chip of the stack and the wiring pattern of the substrate (patent document 1).

Also, in patent documents 2 and 3, a packaging structure has been disclosed in which to arrange three-dimensionally another semiconductor chip on the upper side of one semiconductor chip, a specific interchange substrate (interchange component) is arranged on the substrate, and the upper semiconductor chip is supported by this interchange substrate (interchange component).

Patent document 1: JP-A-11-260851
Patent document 2: JP-A-2002-170921
Patent document 3: JP-A-2002-270760

DISCLOSURE OF THE INVENTION

Problems that the Invention is to Solve

With a packaging technique as described in patent document 1, the thickness of semiconductor device is increased owing to the wiring height of wire bonding, and the thickness of resin that seals the wire portion. Since the bonding wire extends transversely too, there is not necessarily greater area reduction effect than where the semiconductor chips are arranged on the plane.

Also, with a packaging technique as described in patent document 2 or 3, the specific interchange substrate (interchange component) occupies a considerable area, so that the footprint of semiconductor device extends transversely, in which case there is also not necessarily greater area reduction effect than where the semiconductor chips are arranged on the plane. Moreover, since the thickness of the semiconductor device is increased due to the thickness of the specific interchange substrate (interchange component), a volume reduction effect is not fully achieved, and the cost may be possibly increased due to the use of the interchange substrate (interchange component).

In this way, with the conventional packaging techniques, when a plurality of semiconductor chips are packaged in stacks (or packaged three-dimensionally), there are less sufficient points in terms of the area and volume reduction effects and the cost than where the chips are arranged on the plane.

This invention has been achieved in the light of the above-mentioned problems, and it is an object of the invention to package a semiconductor device having the less thickness and the smaller footprint at the lower cost without using any other component than with the conventional methods, when a plurality of semiconductor chips are arranged three-dimensionally, and simplify a manufacturing process for the semiconductor device.

Means for Solving the Problems

A semiconductor device of the invention comprising a substrate formed with a predetermined wiring pattern on a principal plane, a first semiconductor chip having a first electrode for connecting to the wiring pattern on the substrate, the first semiconductor chip being mounted by flip chip packaging by directly connecting the first electrode to an applicable portion of the wiring pattern, and a second semiconductor chip, which is larger in both the longitudinal and transversal lengths than the first semiconductor chip, having a second electrode for connecting to the wiring pattern, the second semiconductor chip being mounted by flip chip packaging by directly connecting the second electrode to an applicable portion of the wiring pattern, in which a total sum of the thickness of the second electrode and the thickness of the applicable portion of the wiring pattern connected to the second electrode is beyond a total sum of the thickness of the first semiconductor chip, the thickness of the first electrode and the thickness of the wiring pattern at the predetermined portion connected to the first electrode, the second semiconductor chip being located above the first semiconductor chip.

Two semiconductor chips having different chip sizes are mounted by flip chip packaging on the common substrate without using any special components. The first semiconductor chip having smaller chip size fully overlaps and is disposed directly under the second semiconductor chip having greater chip size, whereby the thin type three-dimensional flip chip packaging structure is realized. The wall thickness of the first semiconductor chip located on the lower side can be reduced by back grinding (back polishing), and the connection electrode (first electrode) of the first semiconductor chip can be the low bump electrode (with small height) that is formed by metal plating, whereby the height of the first semiconductor chip can be suppressed. On the other hand, the second electrode that supports the second semiconductor chip located on the upper side is the thick electrode (with great height) used for bonding pad to secure the considerable height. Also, when the height is insufficient, a projection portion (extension electrode) may be provided at the tip end of the second electrode by plating to compensate for insufficient height (the projection portion is also formed at the applicable portion of the wiring pattern on the surface of the substrate, to which the second electrode is connected, to further obtain the height.) Thereby, the total sum of the thickness of the second electrode and the thickness of the applicable portion of the wiring pattern connected to the second electrode is beyond the total sum of the thickness of the first semiconductor chip, the thickness of the first electrode and the thickness of the wiring pattern at the predetermined portion connected to the first electrode, whereby the second semiconductor chip can be located directly above the first semiconductor chip, employing the same electrode material and the same electrode forming technique as for packaging the semiconductor of the type in which the semiconductor chips are placed flat on the same plane. Since the first semiconductor and the second semiconductor are mounted by flip chip packaging on the principal plane of the common substrate, the semiconductor device can be reduced in thickness. Also, since the three-dimensional flip chip packaging is made employing the same electrode material and electrode forming technique as for packaging the semiconductor of the type placed flat on the same plane, any special component is unnecessary, and the number of semiconductor devices taken in the same substrate area can be reasonably increased, so that the cost of the semiconductor device can be reduced.

Also, in the semiconductor device of the invention, a shield layer is formed on the surface of the first semiconductor chip opposite to the second semiconductor chip.

Due to the shield layer, each semiconductor chip is less susceptible to electromagnetic noise. The shield layer is provided on the surface of the first semiconductor chip, and does not prevent the slimming-down of the semiconductor device.

Also, in the semiconductor device of the invention, the first electrode of the first semiconductor chip is a metal electrode with small height, and the second electrode of the second semiconductor chip is an electrode with great height composed of a thick metal layer used for a bonding pad.

The first electrode is the low bump electrode (with small height) formed by metal plating, whereby the packaging height of the first semiconductor chip can be suppressed low. On the other hand, the second electrode that supports the second semiconductor chip located on the upper side is the thick electrode (with great height) used for bonding pad to secure the considerable height. That is, the three-dimensional flip chip packaging is made employing the same electrode material and the same electrode forming technique as for packaging the semiconductor of the type in which the semiconductor chips are placed flat on the same plane.

Also, in the semiconductor device of the invention, a projection portion of metal plating is formed at an applicable portion of the wiring pattern to which the second electrode of the second semiconductor chip is connected.

As a measure where the height is insufficient with only the second electrode, the projection portion is formed at the applicable portion of the wiring pattern on the surface of the substrate, to which the second electrode is connected, to compensate for the height. Thereby, the second semiconductor chip is reasonably located above the first semiconductor chip without using the special components, whereby the three-dimensional flip chip structure is implemented.

Also, in the semiconductor device of the invention, the first semiconductor chip is bonded via an insulating resin on the second semiconductor chip.

The semiconductor device has a structure in which the first semiconductor chip is bonded via an insulating resin on the second semiconductor chip. Since the first and second semiconductor chips are integrated, the integrated chips can be mounted on the substrate collectively. Hence, the manufacturing process of the semiconductor device is simplified. Also, the first semiconductor chip that is thin and weak to the stress is bonded on the second semiconductor chip having a predetermined thickness and relatively strong to the stress, and then, the semiconductor chips are mounted by flip chip packaging collectively, whereby there is the effect that there is no restriction on packaging the first semiconductor chip, making the universal packaging method available.

Also, in the semiconductor device of the invention, a gap between the substrate and the second semiconductor chip is sealed with a thermosetting insulating resin.

The semiconductor device has a strong structure with the sealing resin through heat treatment, improving the moisture resistance and the environment resistance.

Also, in the semiconductor device of the invention, a gap between the substrate and the second semiconductor chip is sealed with a thermoplastic insulating resin.

The semiconductor has a strong structure with the sealing resin. Also the adhesive strength of the sealing resin is weakened by heating the entire device, so that the device can be peeled from the adhesive interface and repaired (the semiconductor chip can be remounted).

Also, in the semiconductor device of the invention, the substrate is made of an ultraviolet ray transmitting base material, or has an opening portion in its part, and has a sealing structure with an ultraviolet cure insulating resin in the form of not covering the surface of the first semiconductor chip opposite to the substrate.

In the semiconductor device for optical module such as a semiconductor device for high frequency module or a solid state image pickup element, the surface of the first semiconductor chip opposite to the substrate is opened (i.e., not covered with resin) to form a hollow portion, whereby there are the merits of reducing the parasitic capacity of a high frequency circuit to improve the high frequency characteristics, or enabling the light to be applied from the back side of the substrate to the light receiving plane formed on the back face of the first semiconductor chip. In consideration of this point, in this form, the substrate provided partly with an opening portion (substrate that is partly hollow), or the transparent substrate transmissive to ultraviolet ray (i.e., light) is employed, and the semiconductor device is sealed with resin, except for the back face of the first semiconductor chip (the surface of the substrate), to form a resin sealant that is partly hollow. The reason why the ultraviolet cure insulating resin (ultraviolet ray transmitting substrate) is used as the sealing material is that the resin is prevented from flowing into the hollow portion by applying ultraviolet ray to at least a peripheral portion around the hollow portion from the substrate side to harden the peripheral portion in the resin sealing process.

Also, in another form of the semiconductor device of the invention, the substrate is made of an ultraviolet ray transmitting base material, or has an opening portion in its part, and has a sealing structure with an ultraviolet cure insulating resin only around a connection portion between each of the first and second semiconductor chips and the applicable portion of the wiring pattern on the substrate.

The resin sealed portion is limited to the periphery around the connection portion between the first and second semiconductor chips and the substrate. For the first semiconductor chip, the same effects (i.e., improvement of the frequency characteristics for the high frequency circuit by avoiding the contact with the resin, and ability of applying the ultraviolet ray from the substrate side to input the light from the substrate side) as in the previous form with the hollow portion. Since the resin does not contact the side face or back face of the second semiconductor chip, the frequency characteristics (high frequency characteristics) of the circuit can be improved for not only the first semiconductor chip but also the second semiconductor chip.

Also, a semiconductor device manufacturing method of the invention includes a step of reducing the thickness by back grinding (back polishing) and preparing the substrate formed with a predetermined wiring pattern on its principal plane, and a step of flip chip packaging each of the first semiconductor chip having the first electrode and the second semiconductor chip having the second electrode on the substrate to form a three-dimensional flip chip packaging structure in which the second semiconductor chip is located above the first semiconductor chip.

The thickness of the first semiconductor chip located on the lower side is reduced beforehand, and the thickness of the first electrode is reduced to suppress the position of the first semiconductor chip low, while for the second chip, the total sum of the thickness of the second electrode and the thickness of the wiring pattern portion is increased, whereby the second semiconductor can be mounted by flip chip packaging above the first semiconductor reasonably. There is the effect that the manufacturing process is not complicated because the normal packaging technique is only applied without using the excess components.

Also, the semiconductor device manufacturing method of the invention further includes a step of forming a shield layer on the surface of the first semiconductor chip opposite to the second semiconductor chip, in addition to the above steps.

The shield layer (e.g., thin metal layer made of aluminum) is formed beforehand on the first semiconductor chip, and the first and second semiconductor chips are mounted by flip chip packaging three-dimensionally, as described above, whereby the electromagnetic noise resistance of each chip can be efficiently improved.

Also, in the semiconductor device manufacturing method of the invention, the step of forming the three-dimensional flip chip packaging structure includes a step of integrating the first semiconductor chip and the second semiconductor chip by bonding the first semiconductor chip to the second semiconductor chip, and flip chip packaging the integrated first and second semiconductor chip on the substrate collectively.

The first and second chips are integrated beforehand by bonding, and the integrated chips are mounted by flip chip packaging collectively. Since the flip chip packaging process is required only once, the manufacturing process is simplified.

Also, the semiconductor device manufacturing method of the invention further includes a step of supplying a film- or paste-like insulating resin or anisotropic conductive resin to an area where the first semiconductor chip is mounted by flip chip packaging, and a step of supplying a film- or paste-like insulating resin or anisotropic conductive resin to an area where the second semiconductor chip is mounted by flip chip packaging.

With this method, the resin sealing is completed at the same time when two semiconductor chips are mounted by flip chip packaging, whereby the resin sealant can be formed efficiently.

Also, the semiconductor device manufacturing method of the invention further includes a step of supplying a paste-like insulating resin for sealing, and a step of curing the paste-like insulating resin through a heat treatment.

Thereby, the resin sealant having a strong structure can be formed efficiently, thereby improving the moisture resistance and the environment resistance of the semiconductor device.

Also, the semiconductor device manufacturing method of the invention further includes a step of supplying a paste-like insulating resin, and a step of curing the paste-like insulating resin by applying an ultraviolet ray to at least a part of the insulating resin so that the insulating resin may not flow into a connection area of the first semiconductor chip with the substrate.

With this method, the semiconductor device can be efficiently formed in which the first semiconductor chip is sealed with resin only around the connection electrode, and has a functional face (drive face) exposed (i.e., in hollow state), while the second semiconductor chip is fully sealed with resin. In making the resin sealing, the resin is effectively prevented from flowing into the hollow portion, employing the optical curing of the resin.

Also, in the semiconductor device manufacturing method of the invention, the step of forming the three-dimensional flip chip packaging structure includes a step of supplying a paste-like insulating resin or anisotropic insulating resin to only a connection part of the first semiconductor chip with the substrate, and a step of flip chip packaging the first semiconductor chip on the substrate by applying an ultraviolet ray to at least a part of the insulating resin so that the insulating resin may not flow into the connection part of the first semiconductor chip with the substrate, a step of flip chip packaging the second semiconductor chip on the substrate, a step of supplying a paste-like insulating resin for sealing, and a step of curing the paste-like insulating resin through a heat treatment.

With this method, two semiconductor chips are mounted by flip chip packaging, and the semiconductor device having a strong resin sealed structure can be efficiently manufactured in which the first semiconductor chip is sealed with resin in a hollow state, while the second semiconductor chip is fully sealed with resin.

Also, in the semiconductor device manufacturing method of the invention, the step of forming the three-dimensional flip chip packaging structure includes a step of supplying a paste-like insulating resin or anisotropic insulating resin to only a connection part of the first semiconductor chip with the substrate, a step of flip chip packaging the first semiconductor chip on the substrate by applying an ultraviolet ray to at least a part of the insulating resin so that the insulating resin may not flow into the connection part of the first semiconductor chip with the substrate, a step of flip chip packaging the second semiconductor chip on the substrate, and a step of curing the uncured insulating resin by applying an ultraviolet ray to an uncured part of the insulating resin so that the insulating resin may not flow into the connection area of the second semiconductor chip with the substrate.

With this method, the peripheral portion around the connection part (connection electrode) between each of the first and second semiconductor chips and the substrate is only sealed with resin, while preventing the resin from flowing into the hollow portion employing the optical curing of the resin.

Effect of the Invention

With the invention, the two semiconductor chips having different chip sizes are mounted by flip chip packaging on the principal plane of the common substrate, using the usual packaging technique, without using any special components.

That is, employing a method of reducing the thickness of the first semiconductor chip and the height of the electrode to suppress the height of the support position of the first semiconductor chip, and increasing the height of the electrode for the second semiconductor chip, and forming the projection portion at the applicable portion of the wiring pattern, as needed, to compensate for an insufficient height, the second semiconductor chip can be supported directly above the first semiconductor chip without using any special components and techniques.

Thereby, the first semiconductor chip having smaller chip size fully overlaps and is disposed directly under the second semiconductor chip having greater chip size, whereby the thin type three-dimensional flip chip packaging structure having the compact structure is realized.

Since the first semiconductor and the second semiconductor are mounted by flip chip packaging on the principal plane of the common substrate, the semiconductor device can be remarkably reduced in thickness.

Also, since the three-dimensional flip chip packaging is fabricated employing the same electrode material and the same electrode forming technique as for packaging the semiconductor of the type in which the semiconductor chips are placed flat on the same plane, any special components are unnecessary, and the number of semiconductor devices taken in the same substrate area can be reasonably increased, so that the cost of the semiconductor device is reduced.

Also, the electromagnetic shield layer is formed on the upper face of the first semiconductor chip, and the first and second semiconductor chips are integrated and mounted by flip chip packaging collectively, whereby the higher performance of the semiconductor device and the lower manufacturing cost can be achieved.

Also, employing a method of face down bonding the chips collectively, the first semiconductor chip that is thin and weak to the stress is bonded on the second semiconductor chip having a predetermined thickness and relatively strong to the stress, and then, the semiconductor chips are mounted by flip chip packaging collectively, whereby there is the effect that there is no restriction on packaging the first semiconductor chip, making the universal packaging method available.

Also, the moisture resistance and the environment resistance of the semiconductor device can be improved by forming the resin sealant. The resin sealant takes a form of sealing the entire semiconductor device or a form of sealing only the peripheral portion around the connection part between the first and second semiconductor chips. In the former form, the first and second chips can be protected with resin. In the latter form, the resin does not contact the second semiconductor chip, whereby the high frequency characteristics of the circuit can be improved.

Also, in the semiconductor device for optical module such as a semiconductor device for high frequency module or a solid state image pickup element, the surface of the first semiconductor chip opposite to the substrate is opened (i.e., not covered with resin) to form a hollow portion, reducing the parasitic capacity of a high frequency circuit to improve the high frequency characteristics, or enabling the light to be applied from the back side of the substrate to the light receiving plane formed on the back face of the first semiconductor chip. In consideration of this point, in this invention, a structure in which the resin sealant is provided with the hollow portion can be dealt with. That is, the partly hollow substrate or the transparent substrate transmissive to ultraviolet ray is employed, and the ultraviolet cure insulating resin is employed as the sealing material, the resin is prevented from flowing into the hollow portion by applying ultraviolet ray to at least a peripheral portion around the hollow portion from the substrate side to harden the peripheral portion in the resin sealing process, whereby the small and thin semiconductor device suitable for optical module such as semiconductor device for high frequency module or solid state image pickup element can be realized.

Also, the ultraviolet cure and thermosetting are both employed in hardening the resin, whereby the sealing characteristics of the sealant can be further improved.

Also, with the invention, two semiconductor chips are mounted by flip chip packaging on the common substrate efficiently, and the resin sealant is formed and packaged, as needed, whereby the small, thin and reliable semiconductor device can be manufactured efficiently through the simplified manufacturing process.

In the semiconductor device of the invention, a plurality of semiconductor chips are mounted by flip chip packaging on the same substrate surface, achieving the lower cost, high density and reduction in thickness, and simplifying the manufacturing process. Accordingly, the semiconductor device can be employed as the semiconductor package for a semiconductor memory or SIP (System in Package) for which the higher integration, reduction in thickness and stacking are sought.

The semiconductor device having the hollow structure partly in the resin sealant is suitable for the uses of optical module components such as high frequency module components or solid state image pickup elements.

With the invention, the easy-to-use three-dimensional flip chip packaging technique can be established without using any special components or techniques.

BRIEF DESCRIPTION OF THE DRAWINGS

FIGS. 6A and 6B are cross-sectional views of the semiconductor device showing the structure examples of the semiconductor device having a hollow resin sealant, wherein FIG. 6A is a cross-sectional view of the semiconductor device using the substrate with an opening portion, and FIG. 6B is a cross-sectional view of the semiconductor device using the ultraviolet ray transmitting substrate.

FIGS. 7A and 7B are cross-sectional views of the semiconductor device having a structure in which a hollow portion is provided and only the periphery around the electrode of each semiconductor chip is sealed with resin, wherein FIG. 7A is a cross-sectional view of the semiconductor device using the substrate with the opening portion, and FIG. 7B is a cross-sectional view of the semiconductor device using the ultraviolet ray transmitting substrate.

FIGS. 8A to 8C are the cross-sectional views of the device in a main process, showing a manufacturing method of the semiconductor device of FIG. 1 according to the invention.

FIGS. 12A to 12F are the cross-sectional views of the semiconductor device in the main process, for explaining the manufacturing method of the semiconductor device as shown in FIG. 6A.

FIGS. 13A to 13F are the cross-sectional views of the semiconductor device in the main process, for explaining the manufacturing method of the semiconductor device as shown in FIG. 7A.

Figure 1:
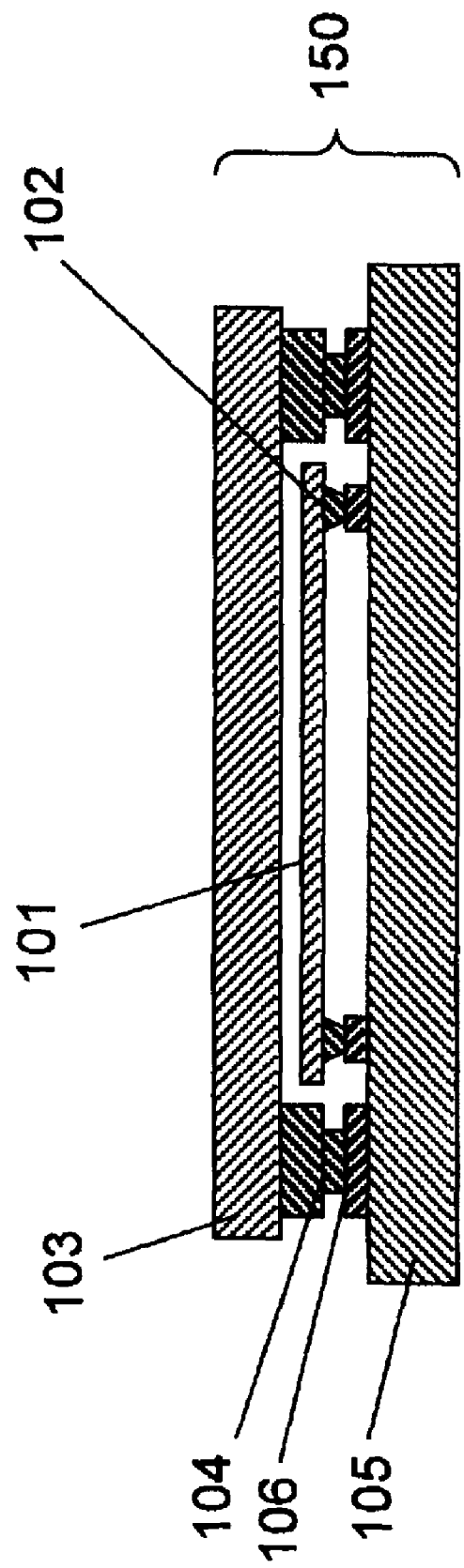
FIG. 1 is a cross-sectional view of a semiconductor device showing a basic structure of the semiconductor device according to the present invention.

DESCRIPTION OF REFERENCE NUMERALS AND SIGNS 101 first semiconductor chip subjected to a thickness reduction process by back grinding
102 first electrode (bump electrode) with small height for face down packaging
103 second semiconductor chip
104 second electrode (bump electrode) with great height for face down packaging (e.g., a metal layer for bonding pad and a plated layer are combined to secure a predetermined height)
105 substrate (packaging substrate)
106 wiring pattern an substrate (terminal electrode)
107 electromagnetic shield layer made of metal
108 plated layer on wiring pattern (metal layer for compensating for an insufficient height of the second electrode)
109(1), 109(2), 109 sealing resin
110 adhesive
150, 152, 154, 156, 158, 160, 162, 164, 166 semiconductor devices (SiP, etc.) having the three-dimensional flip chip structure of the invention
205 packaging substrate having an opening portion
208 ultraviolet ray transmitting packaging substrate
209(1), 209(2) sealing resin (resin having both the thermosetting and ultraviolet cure properties)
A hollow portion (portion provided with sealing resin)

BEST MODE FOR CARRYING OUT THE INVENTION

The preferred embodiments of the present invention will be described below with reference to the accompanying drawings.

EMBODIMENT 1

FIG. 1 is a cross-sectional view of a semiconductor device showing a basic structure of the semiconductor device according to the invention.

As shown in FIG. 1, the semiconductor device 150 is composed of two semiconductor chips 101 and 103 that are mounted by flip chip packaging three-dimensionally.

That is, a first semiconductor chip (a semiconductor chip on the lower side) 101 is formed with a bump electrode (a low electrode; hereinafter referred to as a first electrode) 102 by metal plating. This first electrode 102 is directly connected to a predetermined wiring pattern 106 formed on a substrate 105. That is, the first semiconductor device is mounted by flip chip packaging on a principal plane of the substrate 105.

Likewise, a second semiconductor chip 103 is formed with a high electrode (hereinafter referred to as a second electrode) 104. This second electrode 104 is directly connected to the predetermined wiring pattern 106 formed on the substrate 105. That is, the second semiconductor chip 103, like the first semiconductor chip 101, is mounted by flip chip packaging on the principal plane of the substrate 105.

Any special components are not employed in this three-dimensional flip chip structure.

Herein, the first semiconductor chip 101 is made of a material such as silicone (Si) that can be reduced in thickness, and back ground (back polished) beforehand to a thickness of about 50 to 80 μm.

Also, the first electrode 102 is made of a metal material such as Ni, Au or Cu, its height being suppressed as low as from 5 to 10 μm.

On the other hand, the second semiconductor chip 103 is made of a material capable of flip chip packaging such as Si, SiC or GaAs, its thickness being from about 100 to 600 μm. To further reduce the thickness of the semiconductor device, the second semiconductor chip 103 may be back ground.

The second semiconductor chip 104 is made of a metal material such as Ni, Au or Cu, the height being from 90 to 120 μm. In FIG. 1, the top end of the second electrode 104 is like a protrusion (e.g., such electrode having a protrusion at the top end can be formed by laminating two electrode layers) to secure the height.

The second electrode 104 that supports the second semiconductor chip 103 may be the electrode having great thickness (height) used for bonding pad, for example. Thereby, it is possible to secure the considerable height. That is, the three-dimensional flip chip packaging can be implemented reasonably by making effective use of the same electrode material and the same electrode forming technique as the semiconductor packaging of the type in which the semiconductor chips are placed flat on the same plane.

As described above, since the thickness of the first semiconductor chip 101 is from about 50 to 80 μm, and the height of the first electrode 102 is from about 5 to 10 μm, the position of the upper face of the first semiconductor chip 101 is about 90 μm at maximum from the principal plane of the substrate 105. On the other hand, since the height of the second electrode 104 is from about 90 to 120 μm, the second semiconductor chip 103 can be held directly above the first semiconductor chip 101.

Also, the substrate (packaging substrate) 105 is made of an organic material (epoxy, polyimide, etc.) or an inorganic material (glass, ceramic, etc.). The wiring pattern (terminal electrode) 106 is formed by (electrolytic or electroless) plating with Ni and Au on the surface of a rolled or electrolytic Cu foil as the base in the case of wiring form by plating, in which the total wiring height is from 30 to 50 μm, and the flatness of the electrode part where the semiconductor chips 101 and 103 are packaged is ±2 μm or less. The wiring pattern may be formed by dispensing. In a case of forming the wiring pattern by dispensing, the substrate is coated with nano-paste of Ag, Au or Pg and burned to a thickness from 10 to 20 μm.

Figure 2:
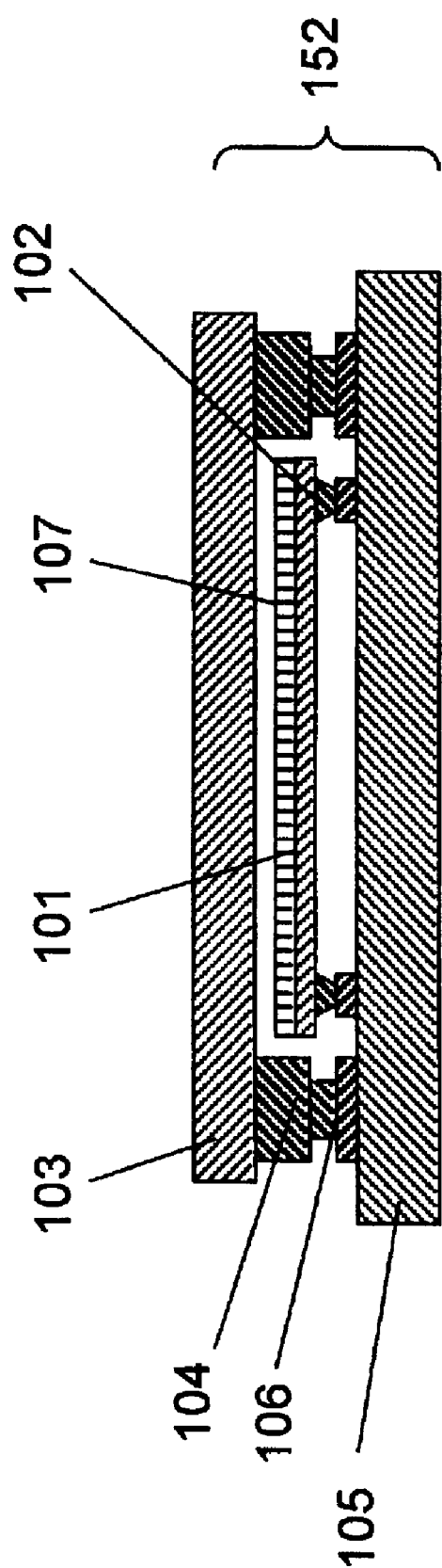
FIG. 2 is a cross-sectional view of the semiconductor device having a structure in which an electromagnetic shield layer is formed on the upper face of a first semiconductor chip.
Figure 3:
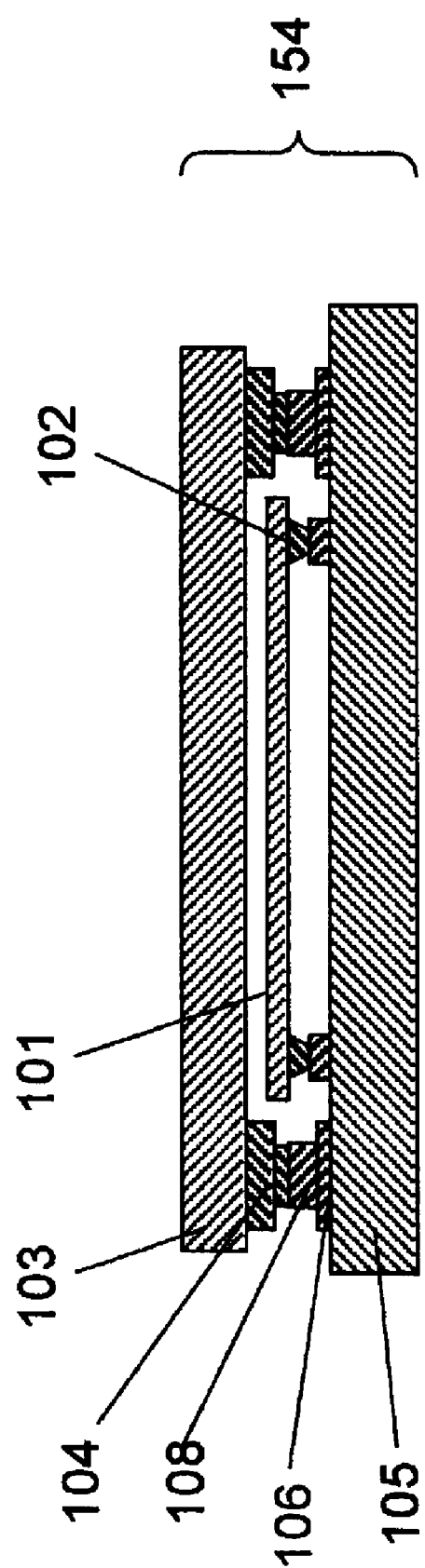
FIG. 3 is a cross-sectional view of the semiconductor device having a structure with the increased height by plating partly a wiring pattern on the substrate.

Various variations or applications of the basic packaging structure as shown in FIG. 1 may be made as shown in FIGS. 2 and 3.

FIG. 2 is a cross-sectional view of the semiconductor device having a structure in which an electromagnetic shield layer is formed on the upper face of the first semiconductor chip.

As shown in FIG. 2, a foil material or (nano) paste layer of Al, Ag, Au or Cu as a shield material 107 is provided 5 to 10 μm thick on the upper face of the semiconductor chip. Thereby, the electromagnetic noise resistance of the first and second semiconductor chips 101 and 103 is improved. The shield material 107, which is very thin, does not prevent the second semiconductor chip 103 from being arranged three-dimensionally.

FIG. 3 is a cross-sectional view of the semiconductor device having a structure in which the height is increased by plating a part of the wiring pattern on the substrate.

If a sufficient height can not be secured only by increasing the height of the second electrode 104, a part of the wiring pattern on the substrate 105 may be plated to compensate for the insufficient height with the plated part.

As shown in FIG. 3, only the wiring pattern 106 connected to the second electrode 104 is plated locally (e.g., Cu plating), so that the thickness of a plating layer 108 is made from about 30 to 50 μm. Thereby, the second semiconductor chip 103 can be supported at higher position by the thickness of the plating layer 108. Accordingly, even if the height is insufficient only with the second electrode 104, the three-dimensional flip chip packaging can be made by compensating for the insufficient height effectively.

In the case where the wiring pattern 106 is formed by dispensing, the electrode portion 108 to compensate for the height is also formed by dispensing. Its thickness is from about 30 to 50 μm.

A method for manufacturing the semiconductor device of FIG. 1 (to FIG. 3) will be described below.

FIGS. 8A to 8C are the cross-sectional views of the semiconductor device in the main process, showing the manufacturing method of the semiconductor device of FIG. 1 according to the invention.

As shown in FIG. 8A, the wiring pattern 106 is formed on the substrate 105 (by evaporation of metal and patterning). At this time, the terminal electrode 108 (FIG. 3) is formed on the wiring pattern 106 by local plating or dispensing, as needed.

Then, the first electrode 102 is formed, and the first semiconductor chip 101 back ground to a thickness of 50 μm is mounted by flip chip packaging on the substrate 105 by a low temperature, low load method with small stress distortion (e.g., ultrasonic bonding at ordinary temperature and with low load, or vacuum bonding at ordinary temperature after plasma treatment on the electrode surface), as shown in FIG. 8B.

And the second semiconductor chip 103 formed with the second electrode 104 is mounted by flip chip packaging on the substrate 105 by an ultrasonic bonding or metal bonding method, as shown in FIG. 8C.

FIGS. 9A to 9D are the cross-sectional views of the semiconductor device in the main process for explaining the manufacturing method of the semiconductor device (semiconductor device having a structure provided with the shield layer) as shown in FIG. 2.

Figure 9:
FIGS. 9A to 9D are the cross-sectional views of the semiconductor device in the main process, showing the manufacturing method of the semiconductor device of FIG. 2 (semiconductor device having a structure in which the shield layer is provided).
Figure 9:
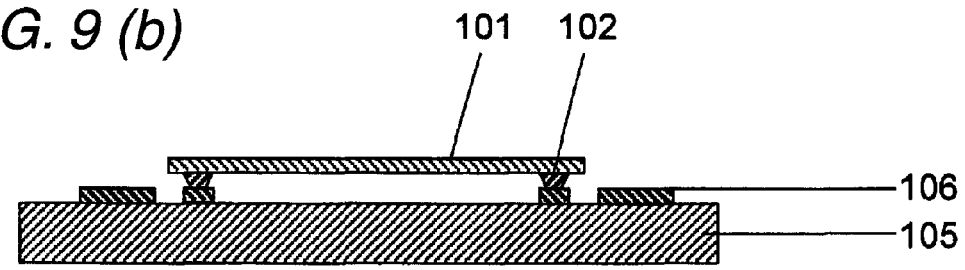
Figure 9:
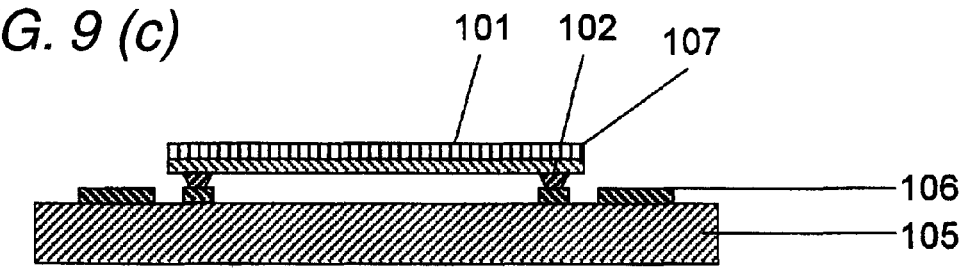
Figure 9:
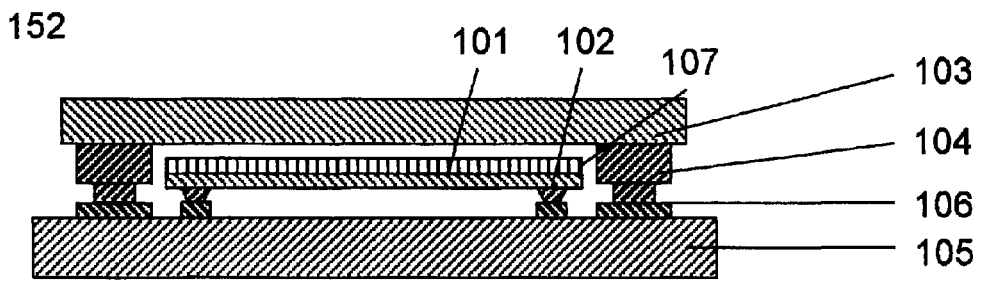

FIGS. 9A, 9B and 9D correspond to FIGS. 8A, 8B and 8C. A characteristic process of the manufacturing method as shown in FIG. 9 is the process of FIG. 9C. That is, in the process of FIG. 9C, the electromagnetic shield layer 107 is formed on the first semiconductor chip 101 that is mounted by flip chip packaging.

Various variations may be made to the invention. For example, the second semiconductor chip 101 may be also back ground thinly to further reduce the thickness of the semiconductor device. Also, the third semiconductor chip may be mounted by flip chip packaging on the same substrate surface to further increase the packaging density. Also, a plurality of semiconductor chips or face packaging parts may be arranged on the lower face of the second semiconductor chip to implement the higher density packaging.

EMBODIMENT 2

Figure 4:
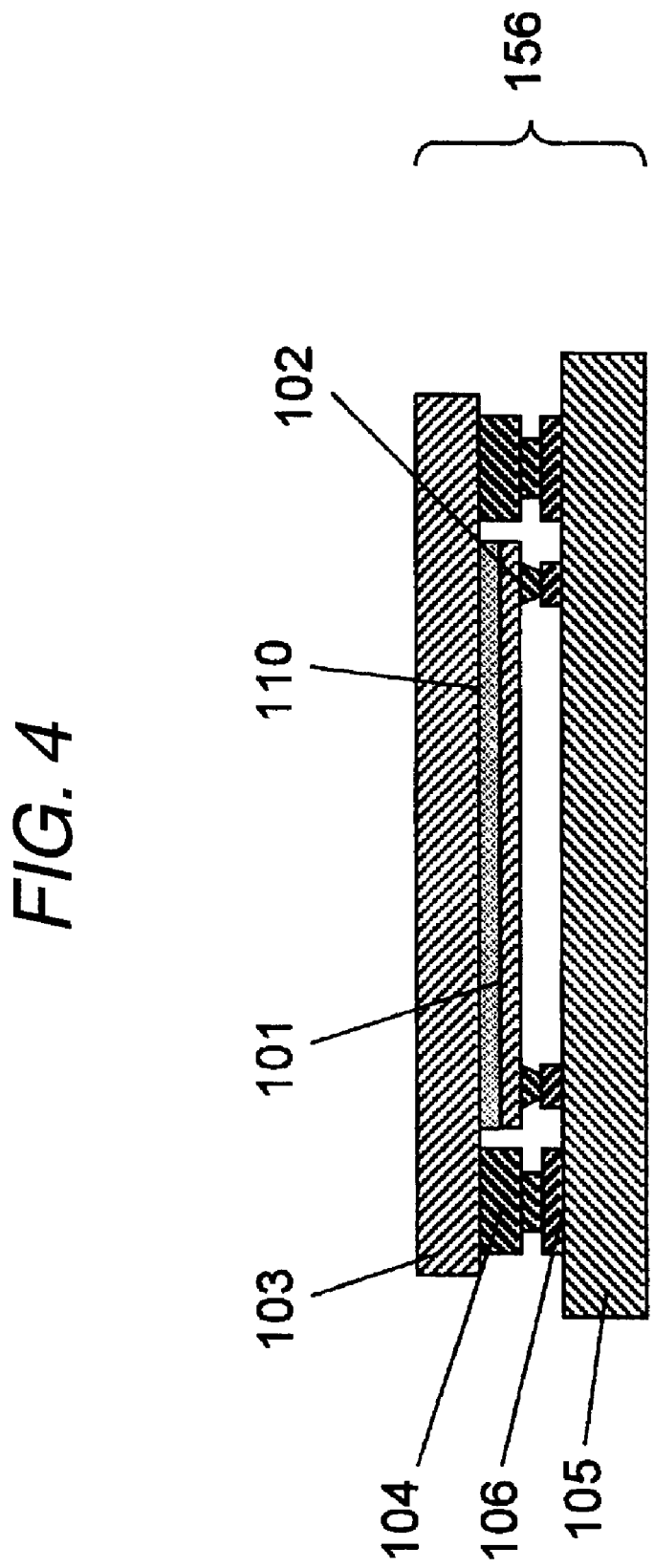
FIG. 4 is a cross-sectional view of the semiconductor device showing another example of the semiconductor device of the invention (the first and second semiconductor chips are integrated).

FIG. 4 is a cross-sectional view of the semiconductor device, showing another example of the semiconductor device (the first and second semiconductor chips are integrated) according to the invention. In FIG. 4, the parts common to the previous drawings are designated by the same reference numerals, and the explanation of the common parts is omitted here. This point also applies to the following drawings.

Though in the previous embodiment two semiconductor chips are mounted by flip chip packaging separately, in this embodiment two semiconductor chips (101, 103) are firstly bonded, and then the integrated semiconductor chips are collectively mounted by flip chip packaging on the substrate 105.

That is, though in the previous embodiment the first semiconductor chip 101 and the second semiconductor chip 103 are not in contact or close contact, in this embodiment the upper face of the first semiconductor chip 101 and the lower face of the second semiconductor chip 103 are fixed together by an adhesive 110.

This adhesive 107 is epoxy resin, polyimide resin, acrylic resin, or silicone resin having high heat resistance (a glass transition temperature from 120 to 180° C.), and desirably free of corrosion inducing components such as halogen or organic phosphoric acid. Also, the curing temperature of the adhesive 107 is from 100 to 200° C.

A method for manufacturing this semiconductor device will be described below.

Figure 10:
FIGS. 10A to 10E are the cross-sectional views of the semiconductor device in the main process, showing the manufacturing method of the semiconductor device of FIG. 4.
Figure 10:
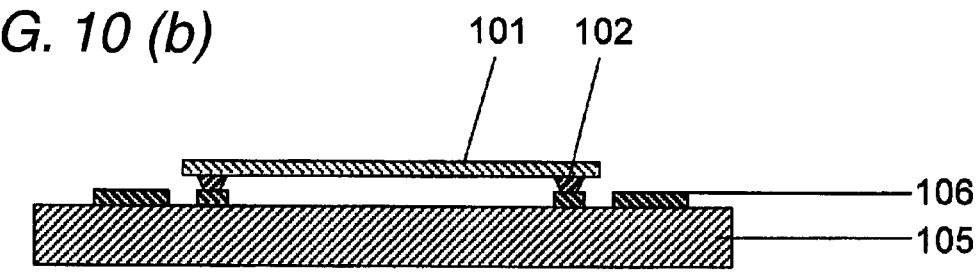
Figure 10:
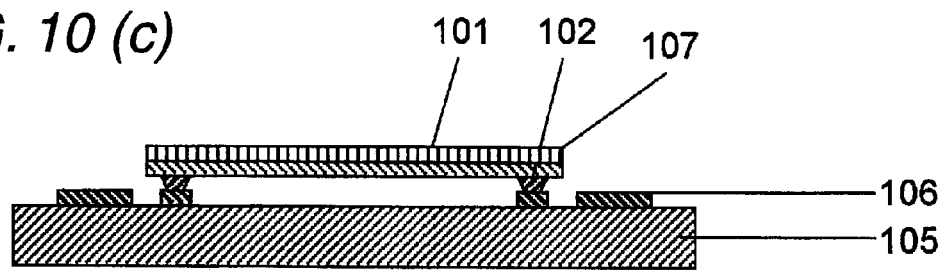
Figure 10:
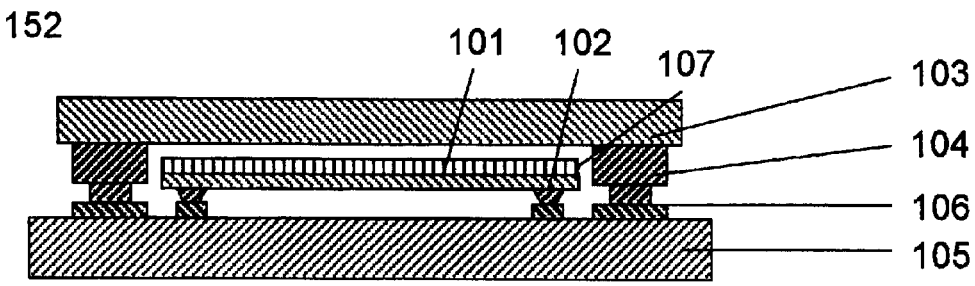

FIG. 10 is a cross-sectional view of the semiconductor device in the man process, showing the manufacturing method of the semiconductor device of FIG. 4.

First of all, the second semiconductor chip 103 is prepared, as shown in FIG. 10A.

Then, the adhesive 110 is supplied not to cover an electrode forming area on the second semiconductor chip 103, as shown in FIG. 10B.

Then, the first semiconductor chip 101 is bonded (die bonding) on the second semiconductor chip 103, as shown in FIG. 10C. The first semiconductor chip 101 is formed with the first electrode (bump electrode) 102. Also, the first semiconductor chip is back ground to a thickness of 50 μm.

And the second electrode (high electrode) 104 is formed on the second semiconductor chip, as shown in FIG. 10D. At this time, there is desirably a dispersion of ±2 μm or less in the height of the first electrode 102 and the second electrode 104 from the back face of the second semiconductor chip 103. Herein, a leveling process for reducing the height dispersion may be added.

Lastly, the integrated semiconductor chips 101 and 103 are collectively mounted by flip chip packaging on the substrate 105 formed with the wiring pattern (terminal electrode) 106 by ultrasonic bonding or metal bonding, as shown in FIG. 10E.

In this way, the first semiconductor chip 101 which is weak to the stress is bonded with the semiconductor chip 103 which is relatively strong to the stress, and they are collectively mounted by flip chip packaging, whereby there is no restriction on packaging the first semiconductor chip, making the universal packaging method available.

Though in the previous explanation the first and second electrodes (102, 104) of the semiconductor chips (101, 103) are formed separately, the chips (101, 103) may be firstly die bonded, and collectively formed with the plating electrodes (102, 104), employing a plating mask. Thereby, the dispersion in the electrode height is reduced.

EMBODIMENT 3

Figure 5:
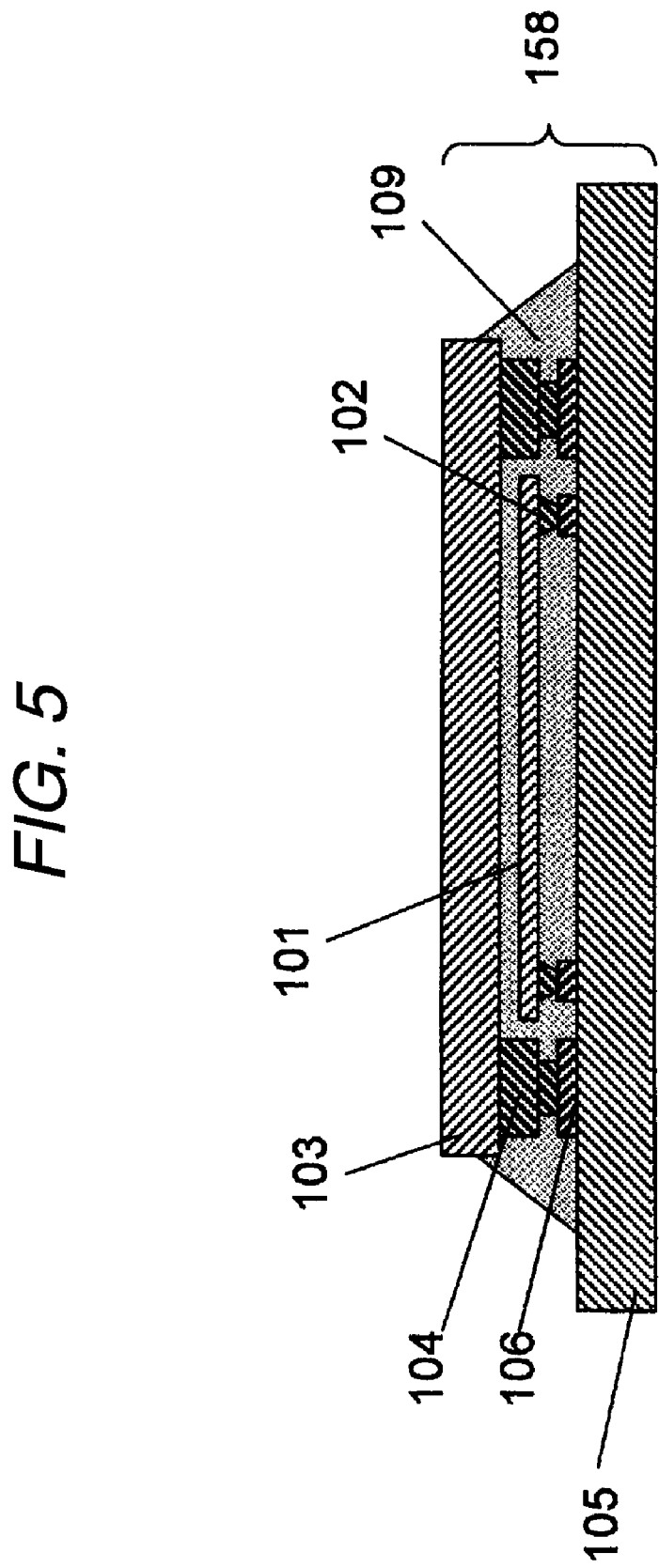
FIG. 5 is a cross-sectional view of the semiconductor device showing another example of the semiconductor device of the invention (the entire semiconductor device is sealed with resin).

FIG. 5 is a cross-sectional view of the semiconductor device, showing another example of the semiconductor device (entirely sealed with resin) according to the invention.

In this embodiment, the bear chips (101, 103) are sealed with resin to form a package structure, improving the water resistance or the environment resistance. As shown in FIG. 5, a semiconductor device 158 of this embodiment is provided with a resin sealant 109 for sealing the entire device (the other structure is the same as in FIG. 1).

The sealing resin 109 is epoxy resin, polyimide resin, acrylic resin, or silicone resin having high heat resistance (a glass transition temperature from 120 to 180° C.), and desirably free of corrosion inducing components such as halogen or organic phosphoric acid. Also, the curing temperature of the sealing resin 109 is from 100 to 200° C.

A method for manufacturing this semiconductor device will be described below.

FIGS. 11A to 11F are the cross-sectional views of the semiconductor device in the main process, showing the manufacturing method of the semiconductor device of FIG. 5.

Figure 11:
FIGS. 11A to 11F are the cross-sectional views of the semiconductor device in the main process, showing the manufacturing method of the semiconductor device of FIG. 5.
Figure 11:
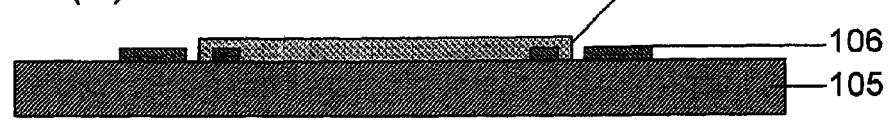
Figure 11:
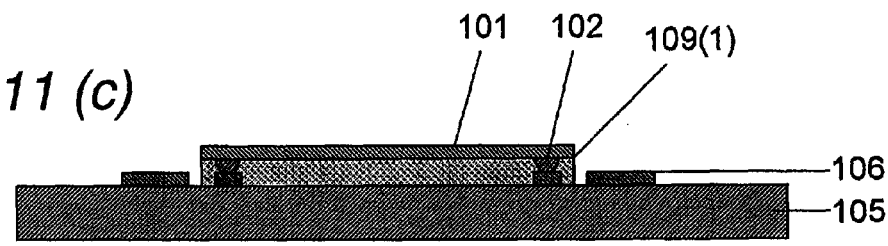
Figure 11:
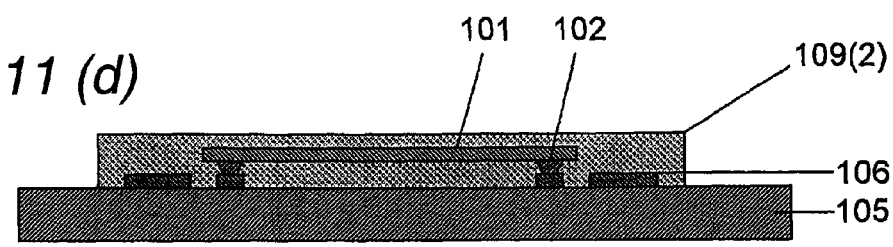
Figure 11:
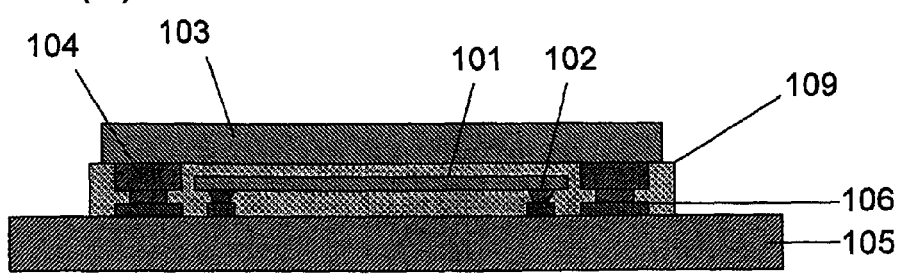
Figure 11:
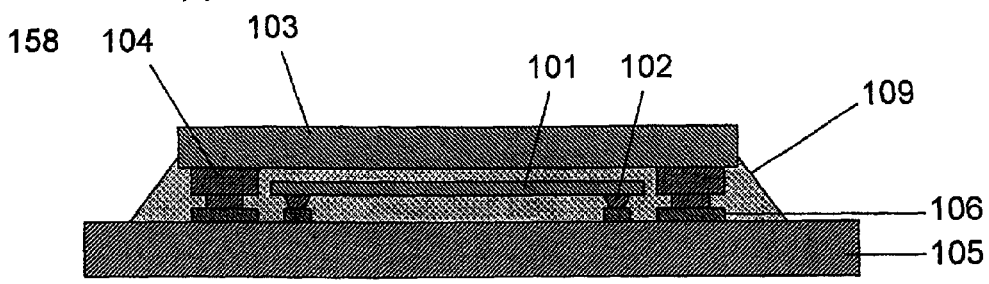

First of all, the wiring pattern (terminal electrode) 106 is formed on the substrate 105, as shown in FIG. 11A.

Then, an insulating adhesive film (NCF) 109(1) that does not obstruct the flip chip packaging is supplied to a packaging area of the first semiconductor chip 101 on the substrate 105, as shown in FIG. 11B. Reference numeral (1) of reference sign 109(1) indicates that the resin is firstly partially supplied.

The insulating adhesive film 109(1) may be an anisotropic conductive film (ACF) or paste type (NCP or ACP).

Then, the first semiconductor chip 101 formed with the first electrode 102 is mounted by flip chip packaging on the substrate 105, as shown in FIG. 11C. This packaging is made by a thermocompression bonding method of heating and compressing the device at 150 to 220° C. for 5 to 20 seconds.

And the same insulating adhesive film 109(2) is supplied to an area where the second semiconductor chip 103 is packaged, as shown in FIG. 11D.

Finally, the second semiconductor chip 103 formed with the second electrode 104 is mounted by flip chip packaging on the substrate 105 by the same thermocompression bonding method, as shown in FIG. 11E.

In this way, the semiconductor device entirely sealed with resin is formed, as shown in FIG. 11F.

The entire resin sealant is designated by reference numeral 109 (i.e., 109 is a total of 109(1) and 109(2)) in FIGS. 11E and 11F.

With the above method, the sealing resin is firstly supplied to the substrate and the semiconductor chip is mounted by flip chip packaging using the thermocompression bonding method. However, an underfill sealing resin paste may be flowed into the semiconductor chips mounted by flip chip packaging in the first and second embodiments, employing a capillary flow phenomenon from the lateral face.

The sealing resin paste has desirably a viscosity of 1 to 30 Pa·s. To assure higher reliability, the paste desirably contains 20 to 50 wt % of silica powder from less than 1 μm to 10 μm in diameter. In this case, there is the advantage that the collective resin sealing is allowed, and the process is simpler than the thermocompression bonding method.

EMBODIMENT 4

In this embodiment, a structure having a hollow portion in a part of the resin sealant is employed, and the light can be applied from the side of the packaging substrate 105.

That is, in a semiconductor device for optical module such as a semiconductor device for high frequency module or a solid state image pickup element, the surface of the first semiconductor chip 101 opposite to the substrate 105 is opened (i.e., not covered with resin) to form a hollow portion, reducing the parasitic capacity of a high frequency circuit to improve the high frequency characteristics, or enabling the light to be applied from the back side of the substrate to a light receiving plane formed on the back face of the first semiconductor chip. In consideration of this point, in this embodiment, the structure having the hollow portion in the resin sealant is employed.

FIGS. 6A and 6B are the cross-sectional views of the semiconductor device, showing the structure examples of the semiconductor device having a hollow resin sealant, wherein FIG. 6A shows an example of the semiconductor device using a substrate with an opening portion, and FIG. 6B shows an example of the semiconductor device using an ultraviolet ray transmitting substrate.

As shown in FIGS. 6A and 6B, the semiconductor device (160, 162) of the embodiment is formed with a hollow portion (A) in a part of the resin sealant 109. Thereby, a functional face (drive face) of the first semiconductor chip 101 is exposed, and the light can be applied from the substrate 205 having the opening portion (or the ultraviolet ray transmitting substrate 208).

When the resin sealant having the hollow portion is formed, there is a problem that the resin sealing material is likely to flow out to an area to be made hollow (hollow portion A).

Thus, in this invention, the sealing resin 109 with an ultraviolet curing property to improve the precision of the resin sealing area of such hollow packaging is employed. That is, the sealing resin components include a cationic polymerization cure resin catalyst to add the ultraviolet curing property to the thermosetting resin.

And in packaging the first semiconductor 101, the ultraviolet ray is applied from the lower face side of the substrate 205 having the opening portion or the ultraviolet ray transmitting substrate 208, and the flip chip packaging is performed under application of the ultraviolet ray. Owing to this application of ultraviolet ray, a peripheral portion around the hollow portion of the sealing resin 109 is optically hardened, and this portion works as a dam to effectively prevent the excess resin from flowing out.

That is, with a technique of employing the partially hollow substrate or the transparent substrate transmissive to the ultraviolet ray and the ultraviolet cure insulating resin as the sealing material, and applying the ultraviolet ray from the substrate side to at least the peripheral portion around the hollow portion to optically harden that peripheral portion in the resin sealing process to prevent the resin from flowing out to the hollow portion, it is possible to construct the small thin semiconductor device suitable for the optical module such as semiconductor device for high frequency module or solid state image pickup element.

A method for manufacturing this semiconductor device as shown in FIG. 6A will be described below.

FIGS. 12A to 12F are the cross-sectional views of the semiconductor device in the main process for explaining the manufacturing method of the semiconductor device as shown in FIG. 6A.

First of all, the predetermined wiring pattern 106 is formed on the substrate 205 provided with an opening portion A, as shown in FIG. 12A.

Then, a resin 209(1) for adding the ultraviolet cure property is supplied to the periphery around a connection electrode portion of the first semiconductor chip 101 on the substrate 205, as shown in FIG. 12B.

Then, the first semiconductor chip 101 formed with the electrode 102 is aligned (positioned) and face down bonded with the substrate 205, as shown in FIG. 12C. At this time, to prevent the resin 209(1) from flowing out of the opening portion of the substrate 205, an ultraviolet ray having a dominant wavelength from a high pressure mercury lamp, a metal halide lamp or a gallium lamp is applied through the opening portion A of the substrate 205.

Thereby, the resin to which the ultraviolet ray is applied is cured, preventing the resin from flowing out of the opening portion A. Thus, the first semiconductor chip 101 is mounted by flip chip packaging in a hollow sealed state.

Through the steps of FIGS. 12D and 12E, a semiconductor device 160 with a resin sealed package having a hollow structure as shown in FIG. 12F is completed. The steps of FIGS. 12D and 12E (steps of packaging the second semiconductor chip 103) are the same as the steps of FIGS. 11D and 11E, and not described here.

Using the ultraviolet ray transmitting substrate (208) as shown in FIG. 6B, the resin sealed package having the hollow structure can be formed through the same process. In this case, the ultraviolet ray is applied in a state where a light shielding mask is placed in contact with the lower face of the substrate 208 so that the ultraviolet ray may be applied to only the area to be hollow.

EMBODIMENT 5

In this embodiment, the first semiconductor chip is hollow and sealed with resin (in the same manner as in the embodiment 4), and the second semiconductor chip is sealed with resin around the electrode.

FIGS. 7A and 7B are the cross-sectional views of the semiconductor device with a structure that has a hollow portion and is sealed with resin only around the electrode of each semiconductor chip, wherein FIG. 7A shows an example of the semiconductor device using the substrate with an opening portion, and FIG. 7B shows an example of the semiconductor device using the ultraviolet ray transmitting substrate.

Though in the embodiment 4 the first semiconductor chip 101 of two semiconductor chips is sealed with resin in a hollow packaged state, and the second semiconductor chip 103 is sealed with resin on the entire lower face of the chip, in this embodiment the second semiconductor chip 103 is also sealed with resin in the hollow packaged state (i.e., partially sealed with resin).

The resin for sealing the periphery around the connection electrode of two semiconductor chips 101 and 103 (with reference numerals 209(1) and 209(2) in FIGS. 7A and 7B) is the ultraviolet cure sealing resin.

A method for manufacturing this semiconductor device will be described below.

FIGS. 13A to 13F are the cross-sectional views of the semiconductor device in the main process for explaining the manufacturing method of the semiconductor device as shown in FIG. 7A.

FIGS. 13A to 13C are the same as FIGS. 12A to 12C. That is, the wiring pattern 106 is formed on the substrate 205 having the opening portion A, the sealing resin 209(1) is partially supplied, and subsequently the first semiconductor chip 101 is mounted by flip chip packaging.

Then, the sealing resin 209(2) is supplied to only an electrode connection portion of the second semiconductor chip 103, as shown in FIG. 13D.

And the second semiconductor chip 103 is mounted by flip chip packaging, as shown in FIG. 13E. At this time, the ultraviolet ray is applied from the side of the substrate 205 and the lateral face of the semiconductor device. Thereby, both the resins 209(1) and 209(2) are hardened, so that the first and second semiconductor chips (101, 103) are mounted by hollow packaging.

The device using the ultraviolet ray transmitting substrate 208 of FIG. 7B can be also formed through the same manufacturing process. The ultraviolet ray is applied by placing a light shielding mask in contact with the lower face of the ultraviolet ray transmitting substrate 208.

In this way, the resin having the thermosetting property and the optical curable property is employed, whereby the resin can be prevented from flowing into the hollow portion because the resin is locally hardened around the hollow portion by applying the ultraviolet ray, and it is impossible to easily realize a form in which only the periphery around the electrode is sealed with resin as a spot.

As described above, with the invention, two semiconductor chips having different chip sizes can be mounted by flip chip packaging on the principal plane of the common substrate, using the usual packaging technology, without using any special components.

That is, with a technique of reducing the thickness of the first semiconductor chip and the height of the electrode to suppress the support position of the first semiconductor chip, on the other hand, increasing the height of the electrode of the second semiconductor chip, and further forming a protruding portion at an applicable portion of the wiring pattern, as needed, to compensate for the insufficient height, the second semiconductor chip can be supported directly above the first semiconductor chip without using any special components or techniques.

Thereby, the three-dimensional flip chip packaging structure of the most compact structure in which the first semiconductor chip having small chip size fully overlaps and is disposed directly under the second semiconductor chip having greater chip size is realized.

Since the first semiconductor chip and the second semiconductor chip are mounted by flip chip packaging on the principal plane of the common substrate, the thickness of the semiconductor-device can be remarkably reduced.

Also, since the three-dimensional flip chip packaging is made employing the same electrode material and the same electrode forming technique as for packaging the semiconductor of the type in which the semiconductor chips are placed flat on the same plane, any special components are unnecessary, and the number of semiconductor devices taken in the same substrate area can be reasonably increased. Accordingly, the cost of the semiconductor device is reduced.

Also, the electromagnetic shield layer is provided on the upper face of the first semiconductor chip, and the first and second semiconductor chips are integrated, and the integrated semiconductor chips are face down packaged collectively, whereby the higher performance of the semiconductor device and the lower manufacturing cost can be attained.

Also, with a technique of face down bonding the chips collectively, the first semiconductor chip that is thin and weak to the stress and the semiconductor chip that has a predetermined thickness and is relatively strong to the stress are bonded together, and then both the chips are collectively mounted by flip chip packaging, whereby there is the effect that there is no restriction on packaging the first semiconductor chip, making the universal packaging method available.

Also, the moisture resistance and the environment resistance of the semiconductor device can be improved by forming the resin sealant. The resin sealant is provided in a form of sealing the entire semiconductor device or a form of sealing only the periphery around the connection between the first and second semiconductor chips. In the former form, the first and second chips are protected by the resin. In the latter form, the second semiconductor chip is prevented from being contacted by the resin, thereby improving the high frequency characteristics of the circuit.

Also, in the semiconductor device for optical module such as a semiconductor device for high frequency module or a solid state image pickup element, the surface of the first semiconductor chip opposite to the substrate is opened (i.e., not covered with resin) to form a hollow portion, reducing the parasitic capacity of a high frequency circuit to improve the high frequency characteristics, or enabling the light to be applied from the back side of the substrate to the light receiving plane formed on the back face of the first semiconductor chip. In consideration of this point, in this invention, the structure having a hollow portion in the resin sealant can be dealt with. That is, with a technique of employing a partially hollow substrate or a transparent substrate transmissive to ultraviolet ray, and an ultraviolet cure insulating resin as the sealing material, and applying an ultraviolet ray from the substrate side to at least a peripheral portion around the hollow portion to optically harden the peripheral portion in the resin sealing process to prevent the resin from flowing into the hollow portion, the small thin semiconductor device suitable for the optical module such as semiconductor device for high frequency module or solid state image pickup element can be realized.

Also, in curing the resin, both the ultraviolet curing and the heat curing are employed at the same time, thereby improving the sealing characteristics of the sealant.

Also, with the invention, two semiconductor chips can be mounted by flip chip packaging on the common substrate efficiently, and the resin sealant is formed for packaging, as needed, whereby the small, thin and reliable semiconductor device can be manufactured efficiently through a simplified manufacturing process.

In the semiconductor device of the invention, a plurality of semiconductor chips are mounted by flip chip packaging on the same substrate surface at the high density and in the small thickness with the low cost through the simplified manufacturing process. Accordingly, the semiconductor device of the invention can be utilized as the semiconductor package such as a semiconductor memory or SIP (System in Package) that asks for higher integration, smaller thickness and multi-layer.

Also, the semiconductor device having a hollow structure in a part of the resin sealant is suitable for the uses of the optical module component such as a high frequency module component or a solid state image pickup element.

With this invention, the three-dimensional flip chip packaging technique that does not employ any special components or techniques and is easy to use can be established.

While the invention has been described above in detail with reference to the specific embodiments, it will be apparent to those skilled in the art that various changes or modifications may be made thereto without departing from the spirit or scope of the invention. This application is based on Japanese Patent Application filed on Jan. 25, 2005, with the application number 2005-016818, whose contents are hereby incorporated by way of reference.

INDUSTRIAL APPLICABILITY

The invention achieves the effect that the semiconductor device of higher density and small thickness can be realized with lower cost by flip chip packaging a plurality of semiconductor chips on the same substrate surface. Accordingly, the semiconductor device of the invention can be utilized as the semiconductor device for the semiconductor memory and SIP (System in Package). Also, the semiconductor device having a hollow structure in a part of the resin sealant is usable as the semiconductor device for the optical module component such as high frequency module or solid state image pickup element.

The invention claimed is:

1. A semiconductor device comprising:
    a substrate formed with a predetermined wiring pattern on a principal plane;
    a first semiconductor chip having a first electrode for connecting to said wiring pattern on said substrate, said first semiconductor chip being mounted by flip chip packaging by directly connecting said first electrode to an applicable portion of said wiring pattern; and
    a second semiconductor chip, which is larger in both the longitudinal and transversal lengths than said first semiconductor chip, having a second electrode for connecting to said wiring pattern, said second semiconductor chip being mounted by flip chip packaging by directly connecting said second electrode an applicable portion of said wiring pattern, in which a total sum of the thickness of said second electrode and the thickness of the applicable portion of said wiring pattern connected to said second electrode is beyond a total sum of the thickness of said first semiconductor chip, the thickness of said first electrode and the thickness of the wiring pattern at said predetermined portion connected to said first electrode, said second semiconductor chip being located above said first semiconductor chip;
    wherein said substrate is made of an ultraviolet ray transmitting base material or has an opening portion in its part, and wherein a sealing structure of an ultraviolet cure insulating resin is formed on said substrate in the form of not covering the surface of said first semiconductor chip opposite to said substrate except that said sealing structure covers a peripheral portion around a connection portion between said first semiconductor chip and the applicable portion of said wiring pattern on said substrate.

2. A semiconductor device comprising:
    a substrate formed with a predetermined wiring pattern on a principal plane;
    a first semiconductor chip having a first electrode for connecting to said wiring pattern on said substrate, said first semiconductor chip being mounted by flip chip packaging by directly connecting said first electrode an applicable portion of said wiring pattern; and
    a second semiconductor chip, which is larger in both the longitudinal and transversal lengths than said first semiconductor chip, having a second electrode for connecting to said wiring pattern, said second semiconductor chip being mounted by flip chip packaging by directly connecting said second electrode to an applicable portion of said wiring pattern, in which a total sum of the thickness of said second electrode and the thickness of the applicable portion of said wiring pattern connected to said second electrode is beyond a total sum of the thickness of said first semiconductor chip, the thickness of said first electrode and the thickness of the wiring pattern at said predetermined portion connected to said first electrode, said second semiconductor chip being located above said first semiconductor chip;
    wherein said substrate is made of an ultraviolet ray transmitting base material or has an opening portion in its part, and wherein a sealing structure of an ultraviolet cure insulating resin is formed only around a first connection portion between said first semiconductor chip and the applicable portion of said wiring pattern on said substrate and around a second connection portion between said second semiconductor chip and the applicable portion of said wiring pattern on said substrate.

3. The semiconductor device according to claim 1 or 2, wherein a shield layer is formed on the surface of said first semiconductor chip opposite to said second semiconductor chip.

4. The semiconductor device according to claim 1 or 2, wherein said first electrode of said first semiconductor chip is a metal electrode with small height, and said second electrode of said second semiconductor chip is an electrode with great height composed of a thick metal layer used for a bonding pad.

5. The semiconductor device according to claim 1 or 2, wherein a projection portion of metal plating is formed at an applicable portion of said wiring pattern to which said second electrode of said second semiconductor chip is connected.

6. The semiconductor device according to claim 1 or 2, wherein the first semiconductor chip is bonded via an insulating resin on the second semiconductor chip.

7. The semiconductor device according to claim 1, wherein said sealing structure is formed in a gap between said substrate and said second semiconductor chip except for a bottom surface of said first semiconductor chip facing to a top surface of said substrate.

8. The semiconductor device according to claim 2, wherein said sealing structure does not cover the surface of said first semiconductor chip opposite to said substrate except for a peripheral portion around said first connection portion.

* * * * *